(12) United States Patent
Lee et al.

(10) Patent No.: US 11,355,500 B2
(45) Date of Patent: Jun. 7, 2022

(54) STATIC RANDOM ACCESS MEMORY CELL AND MANUFACTURING METHOD THEREOF

(71) Applicant: TAIWAN SEMICONDUCTOR MANUFACTURING CO., LTD., Hsinchu (TW)

(72) Inventors: Yi-Jing Lee, Hsinchu (TW); Tsz-Mei Kwok, Hsinchu (TW); Ming-Hua Yu, Hsinchu (TW); Kun-Mu Li, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 35 days.

(21) Appl. No.: 16/927,751

(22) Filed: Jul. 13, 2020

(65) Prior Publication Data
US 2020/0343250 A1    Oct. 29, 2020

Related U.S. Application Data

(60) Continuation of application No. 16/234,283, filed on Dec. 27, 2018, now Pat. No. 10,714,487, which is a
(Continued)

(51) Int. Cl.
*H01L 27/11* (2006.01)
*H01L 27/02* (2006.01)
(Continued)

(52) U.S. Cl.
CPC .. *H01L 27/1104* (2013.01); *H01L 21/823807* (2013.01); *H01L 21/823814* (2013.01);
(Continued)

(58) Field of Classification Search
CPC ......... H01L 27/1104; H01L 21/823878; H01L 21/823814; H01L 21/823821;
(Continued)

(56) References Cited

U.S. PATENT DOCUMENTS 8,264,021 B2    9/2012 Lai et al.
8,652,894 B2    2/2014 Lin et al.
(Continued)

FOREIGN PATENT DOCUMENTS

CN    102034871 A    4/2011
CN    102157555 A    8/2011
(Continued)

*Primary Examiner* — Karen Kusumakar
*Assistant Examiner* — Adam S Bowen
(74) *Attorney, Agent, or Firm* — Maschoff Brennan

(57) ABSTRACT

A static random access memory (SRAM) cell includes a semiconductor fin, a first gate structure, a second gate structure, an epitaxy structure, and a first fin sidewall structure. The first gate structure crosses the semiconductor fin to form a pull-down (PD) transistor. The second gate structure crosses the semiconductor fin to form a pull-gate (PG) transistor. The epitaxy structure is on the semiconductor fin and between the first and second gate structures. The first fin sidewall structure is on a first side of the epitaxy structure and between the first and second gate structures. A method for manufacturing the semiconductor device is also disclosed.

20 Claims, 11 Drawing Sheets

Related U.S. Application Data continuation of application No. 15/702,569, filed on Sep. 12, 2017, now Pat. No. 10,170,483, which is a division of application No. 14/938,311, filed on Nov. 11, 2015, now Pat. No. 9,768,178.

(51) Int. Cl.
| | | |
|---|---|---|
| *H01L 29/78* | (2006.01) | |
| *H01L 21/8238* | (2006.01) | |
| *H01L 27/092* | (2006.01) | |
| *H01L 29/06* | (2006.01) | |
| *H01L 29/08* | (2006.01) | |
| *H01L 29/165* | (2006.01) | |

(52) U.S. Cl.
CPC ........... *H01L 21/823821* (2013.01); *H01L 21/823878* (2013.01); *H01L 27/0207* (2013.01); *H01L 27/0924* (2013.01); *H01L 29/0653* (2013.01); *H01L 29/0847* (2013.01); *H01L 29/7848* (2013.01); *H01L 29/7853* (2013.01); *H01L 29/165* (2013.01)

(58) Field of Classification Search
CPC ........... H01L 29/7853; H01L 29/0653; H01L 21/823807; H01L 29/0847; H01L 27/0924
See application file for complete search history.

(56) References Cited

U.S. PATENT DOCUMENTS

| | | | |
|---|---|---|---|
| 8,703,556 B2 | 4/2014 | Kelly et al. | |
| 8,865,560 B2 | 10/2014 | Mor et al. | |
| 9,425,201 B2 | 8/2016 | Liaw | |
| 2013/0244396 A1* | 9/2013 | Oh | H01L 29/66795 |
| | | | 438/400 |
| 2014/0131776 A1 | 5/2014 | Ching et al. | |
| 2014/0131813 A1* | 5/2014 | Liaw | H01L 29/0657 |
| | | | 257/401 |
| 2014/0203338 A1 | 7/2014 | Kelly et al. | |
| 2015/0137181 A1 | 5/2015 | Basker et al. | |
| 2015/0214366 A1 | 7/2015 | Chang et al. | |
| 2015/0279995 A1 | 10/2015 | Maeda et al. | |
| 2015/0333061 A1* | 11/2015 | Kim | H01L 29/7849 |
| | | | 257/401 |
| 2016/0064387 A1* | 3/2016 | Jeong | H01L 21/823814 |
| | | | 257/401 |
| 2016/0315172 A1* | 10/2016 | Wu | H01L 29/785 |

FOREIGN PATENT DOCUMENTS

| | | |
|---|---|---|
| CN | 103295904 A | 9/2013 |
| CN | 103681347 A | 3/2014 |
| TW | 201419451 A | 5/2014 |

\* cited by examiner

STATIC RANDOM ACCESS MEMORY CELL AND MANUFACTURING METHOD THEREOF

PRIORITY CLAIM AND CROSS-REFERENCE

The present application is a continuation application of the application Ser. No. 16/234,283, filed on Dec. 27, 2018, now U.S. Pat. No. 10,714,487, issued on Jul. 14, 2020, which is a continuation application of the application Ser. No. 15/702,569, filed on Sep. 12, 2017, now U.S. Pat. No. 10,170,483, issued on Jan. 1, 2019, which is a divisional of the application Ser. No. 14/938,311, filed on Nov. 11, 2015, now U.S. Pat. No. 9,768,178, issued on Sep. 19, 2017, which are incorporated herein by reference in their entireties.

BACKGROUND

Static Random Access Memory (Static RAM or SRAM) is a semiconductor memory that retains data in a static form as long as the memory has power. SRAM is faster and more reliable than the more common dynamic RAM (DRAM). The term static is derived from the fact that it doesn't need to be refreshed like DRAM. SRAM is used for a computer's cache memory and as part of the random access memory digital-to-analog converter on a video card.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 6A are top views of a method for manufacturing an SRAM device at various stages in accordance with some embodiments of the present disclosure.

FIGS. 2B to 6B are perspective views of area B of FIGS. 2A to 6A.

DETAILED DESCRIPTION

Figure 1:
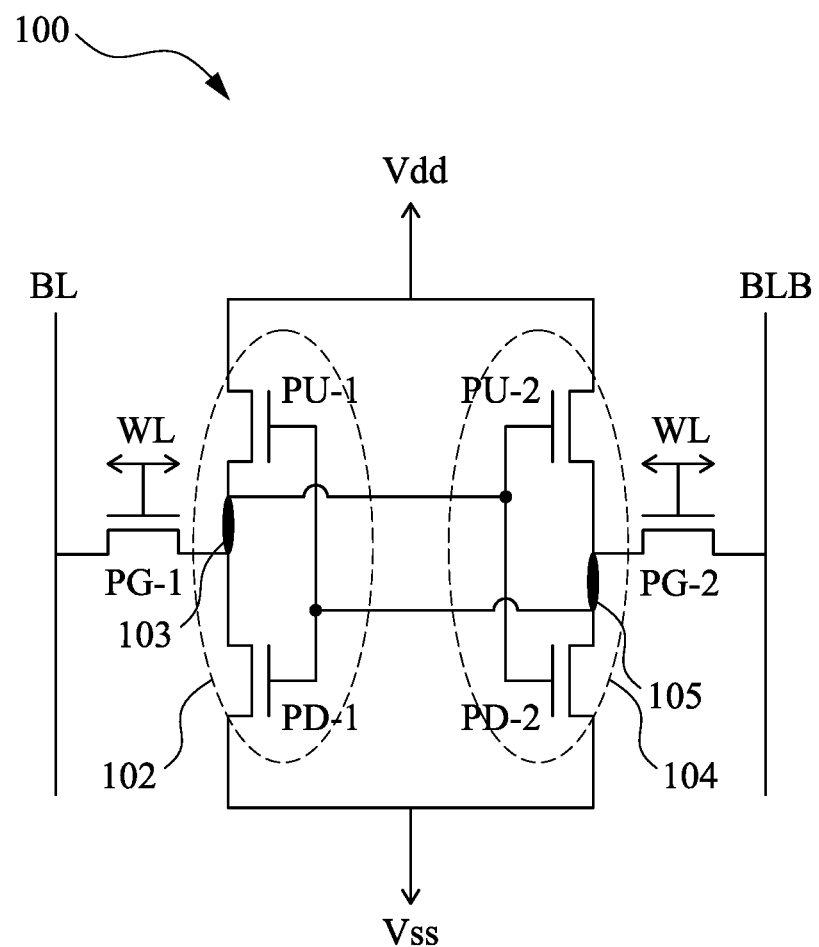
FIG. 1 is a circuit diagram of a six transistor (6T) SRAM cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, a static random-access memory (SRAM) formed of fin field effect transistors (FinFETs). The embodiments of the disclosure may also be applied, however, to a variety of semiconductor devices. Various embodiments will be explained in detail with reference to the accompanying drawings.

Static random-access memory (SRAM) is a type of volatile semiconductor memory that uses bistable latching circuitry to store each bit. Each bit in an SRAM is stored on four transistors (PU-1, PU-2, PD-1, and PD-2) that form two cross-coupled inverters. This memory cell has two stable states which are used to denote 0 and 1. Two additional access transistors (PG-1 and PG-2) are electrically connected to the two cross-coupled inventers and serve to control the access to a storage cell during read and write operations.

FIG. 1 is a circuit diagram of a six transistor (6T) SRAM cell. The SRAM cell 100 includes a first inverter 102 formed by a pull-up transistor PU-1 and a pull-down transistor PD-1. The SRAM cell 100 further includes a second inverter 104 formed by a pull-up transistor PU-2 and a pull-down transistor PD-2. Furthermore, both the first inverter 102 and second inverter 104 are coupled between a voltage bus Vdd and a ground potential Vss. In some embodiment, the pull-up transistor PU-1 and PU-2 can be p-type transistors while the pull-down transistors PD-1 and PD-2 can be n-type transistors, and the claimed scope of the present disclosure is not limited in this respect.

In FIG. 1, the first inverter 102 and the second inverter 104 are cross-coupled. That is, the first inverter 102 has an input connected to the output of the second inverter 104. Likewise, the second inverter 104 has an input connected to the output of the first inverter 102. The output of the first inverter 102 is referred to as a storage node 103. Likewise, the output of the second inverter 104 is referred to as a storage node 105. In a normal operating mode, the storage node 103 is in the opposite logic state as the storage node 105. By employing the two cross-coupled inverters, the SRAM cell 100 can hold the data using a latched structure so that the stored data will not be lost without applying a refresh cycle as long as power is supplied through Vdd.

In an SRAM device using the 6T SRAM cells, the cells are arranged in rows and columns. The columns of the SRAM array are formed by a bit line pairs, namely a first bit line BL and a second bit line BLB. The cells of the SRAM device are disposed between the respective bit line pairs. As shown in FIG. 1, the SRAM cell 100 is placed between the bit line BL and the bit line BLB.

In FIG. 1, the SRAM cell 100 further includes a first pass-gate transistor PG-1 connected between the bit line BL and the output 103 of the first inverter 102. The SRAM cell 100 further includes a second pass-gate transistor PG-2 connected between the bit line BLB and the output 105 of the second inverter 104. The gates of the first pass-gate transistor PG-1 and the second pass-gate transistor PG-2 are connected to a word line WL, which connects SRAM cells in a row of the SRAM array.

In operation, if the pass-gate transistors PG-1 and PG-2 are inactive, the SRAM cell 100 will maintain the complementary values at storage nodes 103 and 105 indefinitely as long as power is provided through Vdd. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

In the circuit diagram of FIG. 1, the pull-up transistors PU-1, PU-2 are p-type transistors. The pull-down transistors PD-1, PD-2, and the pass-gate transistors PG-1, PG-2 are n-type transistors. According to various embodiments, the pull-up transistors PU-1, PU-2, the pull-down transistors PD-1, PD-2, and the pass-gate transistors PG-1, PG-2 are implemented by FinFETs.

The structure of the SRAM cell 100 in FIG. 1 is described in the context of the 6T-SRAM. One of ordinary skill in the art, however, should understand that features of the various embodiments described herein may be used for forming other types of devices, such as an 8T-SRAM memory device, or memory devices other than SRAMs, such as standard cell, gated diode or ESD (Electrostatic Discharge) devices. Furthermore, embodiments of the present disclosure may be used as stand-alone memory devices, memory devices integrated with other integrated circuitry, or the like.

Figure 2A:
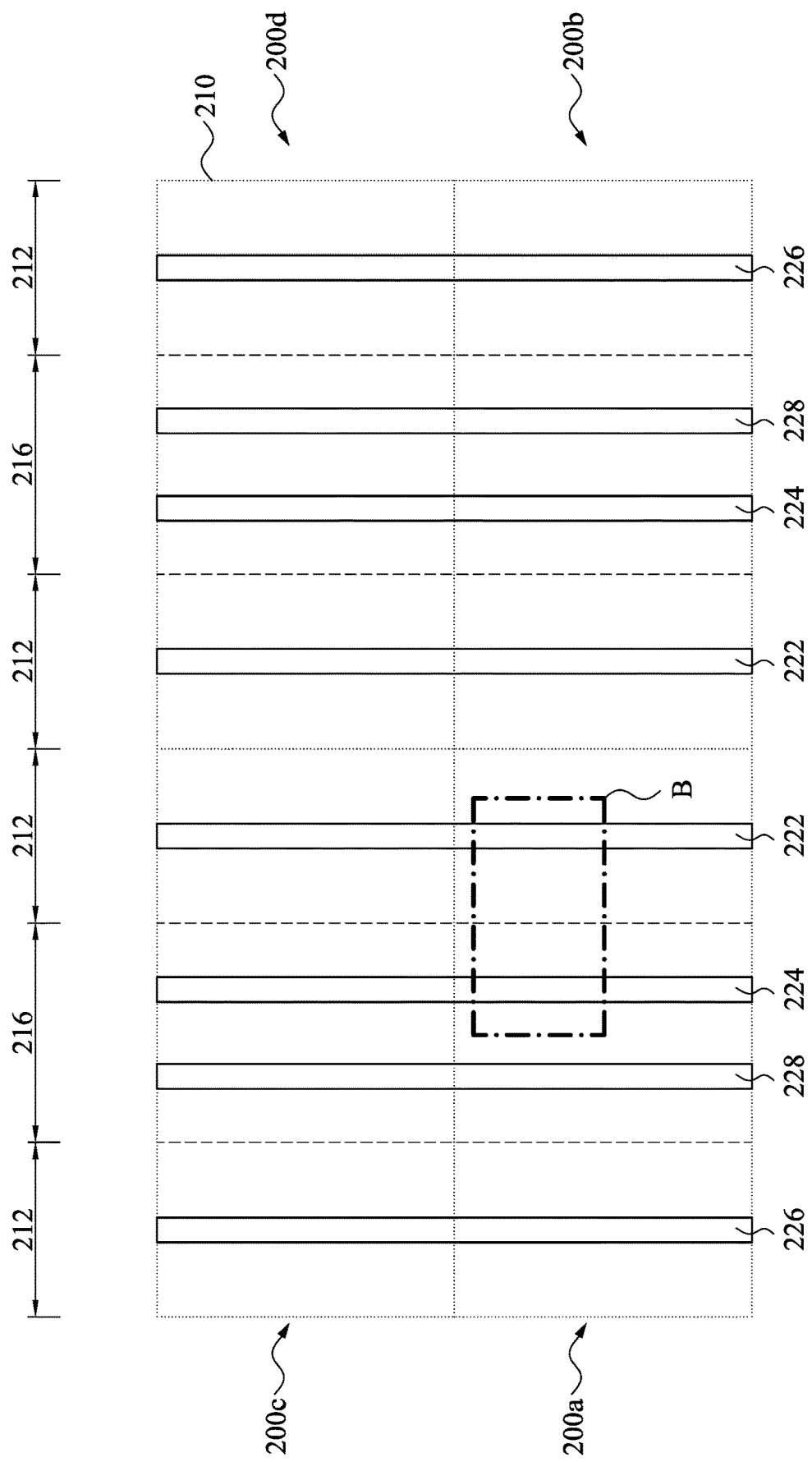
Figure 2B:
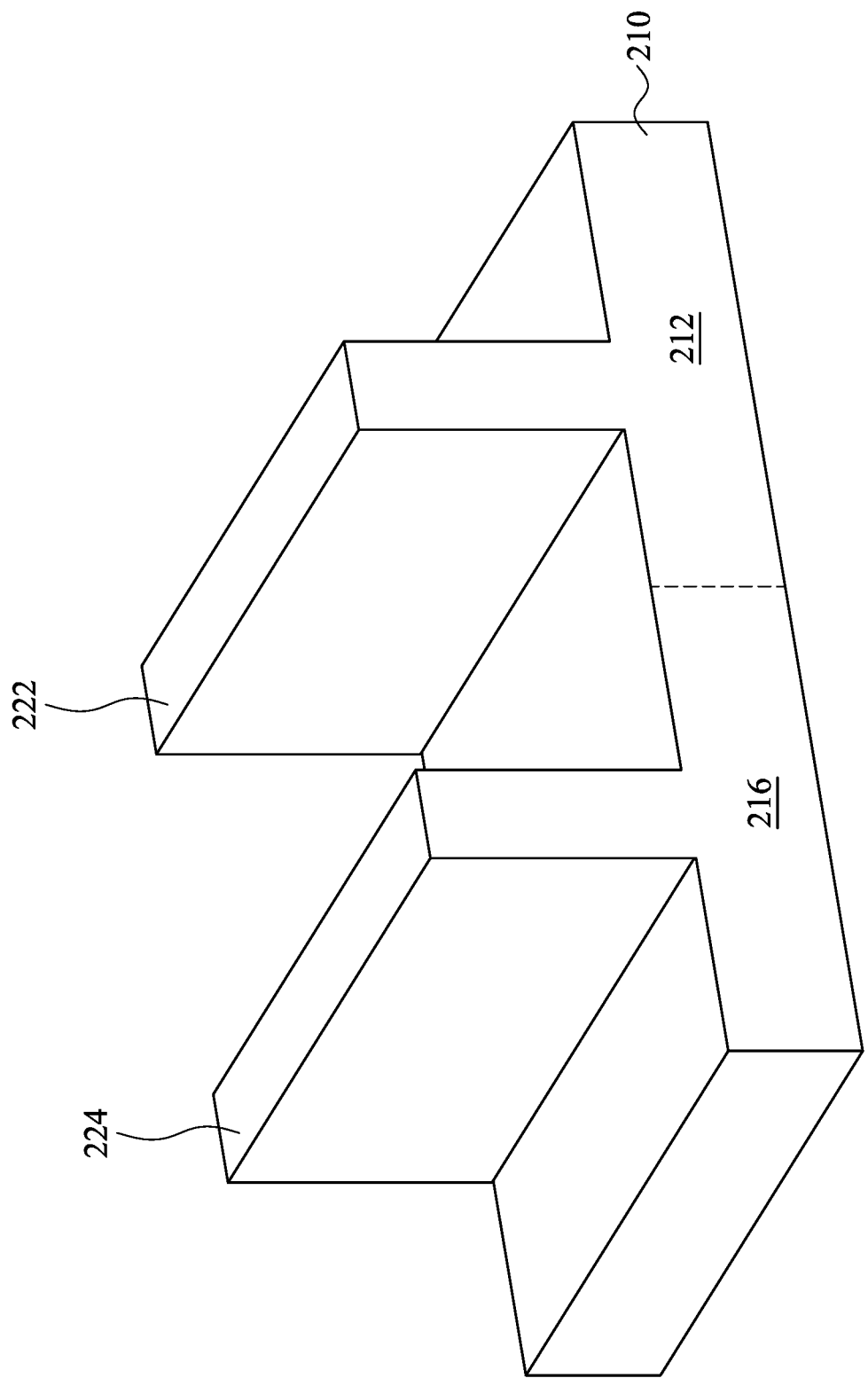

FIGS. 2A to 6A are top views of a method for manufacturing an SRAM device at various stages in accordance with some embodiments of the present disclosure, and FIGS. 2B to 6B are perspective views of area B of FIGS. 2A to 6A. In FIGS. 2A to 6A, a SRAM device including four SRAM cells 200a, 200b, 200c, and 200d are illustrated. In some other embodiments, however, the number of the SRAM cells 200a, 200b, 200c, and 200d in the SRAM device is not limited in this respect. Reference is made to FIGS. 2A and 2B. A substrate 210 is provided. In some embodiments, the substrate 210 may be a semiconductor material and may include known structures including a graded layer or a buried oxide, for example. In some embodiments, the substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 210. Alternatively, the silicon substrate 210 may be an active layer of a semiconductor-on-insulator (SOI) substrate or a multi-layered structure such as a silicon-germanium layer formed on a bulk silicon layer.

A plurality of p-well regions 212 and a plurality of n-well regions 216 are formed in the substrate 210. One of the n-well regions 216 is formed between two of the p-well regions 212. The p-well regions 212 are implanted with P dopant material, such as boron ions, and the n-well regions 216 are implanted with N dopant material such as arsenic ions. During the implantation of the p-well regions 212, the n-well regions 216 are covered with masks (such as photoresist), and during implantation of the n-well regions 216, the p-well regions 212 are covered with masks (such as photoresist).

A plurality of semiconductor fins 222, 224, 226, and 228 are formed on the substrate 210. In greater detail, the semiconductor fins 222 and 226 are formed on the p-well regions 212, and the semiconductor fins 224 and 228 are formed on the n-well regions 216. The semiconductor fin 222 is adjacent to the semiconductor fin 224, and the semiconductor fin 226 is adjacent to the semiconductor fin 228. In some embodiments, the semiconductor fins 222, 224, 226, and 228 include silicon. It is noted that the number of the semiconductor fins 222, 224, 226, and 228 in FIG. 2A is illustrative, and should not limit the claimed scope of the present disclosure. A person having ordinary skill in the art may select suitable number for the semiconductor fins 222, 224, 226, and 228 according to actual situations.

The semiconductor fins 222, 224, 226, and 228 may be formed, for example, by patterning and etching the substrate 210 using photolithography techniques. In some embodiments, a layer of photoresist material (not shown) is deposited over the substrate 210. The layer of photoresist material is irradiated (exposed) in accordance with a desired pattern (the semiconductor fins 222, 224, 226, and 228 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

Figure 3A:
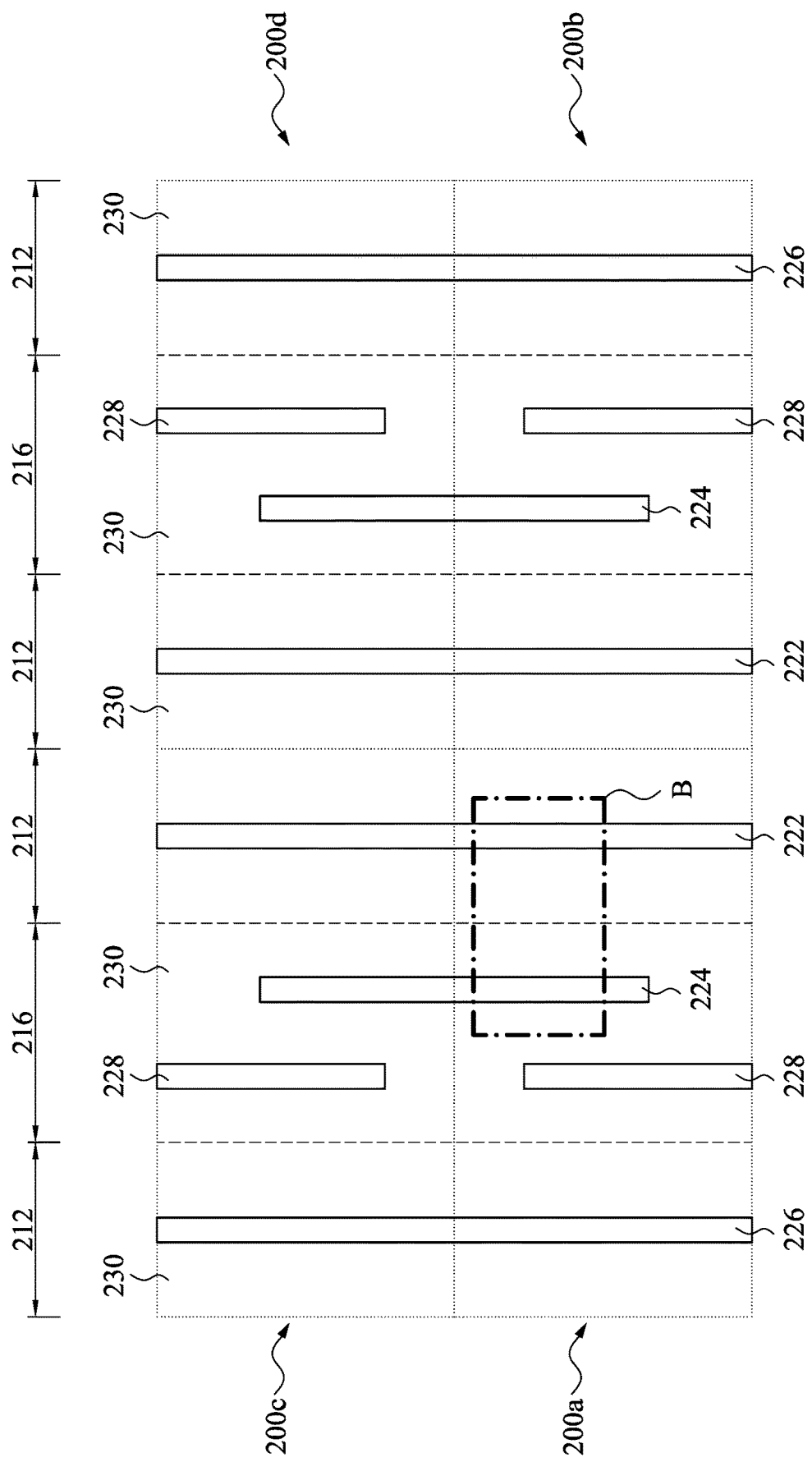
Figure 3B:
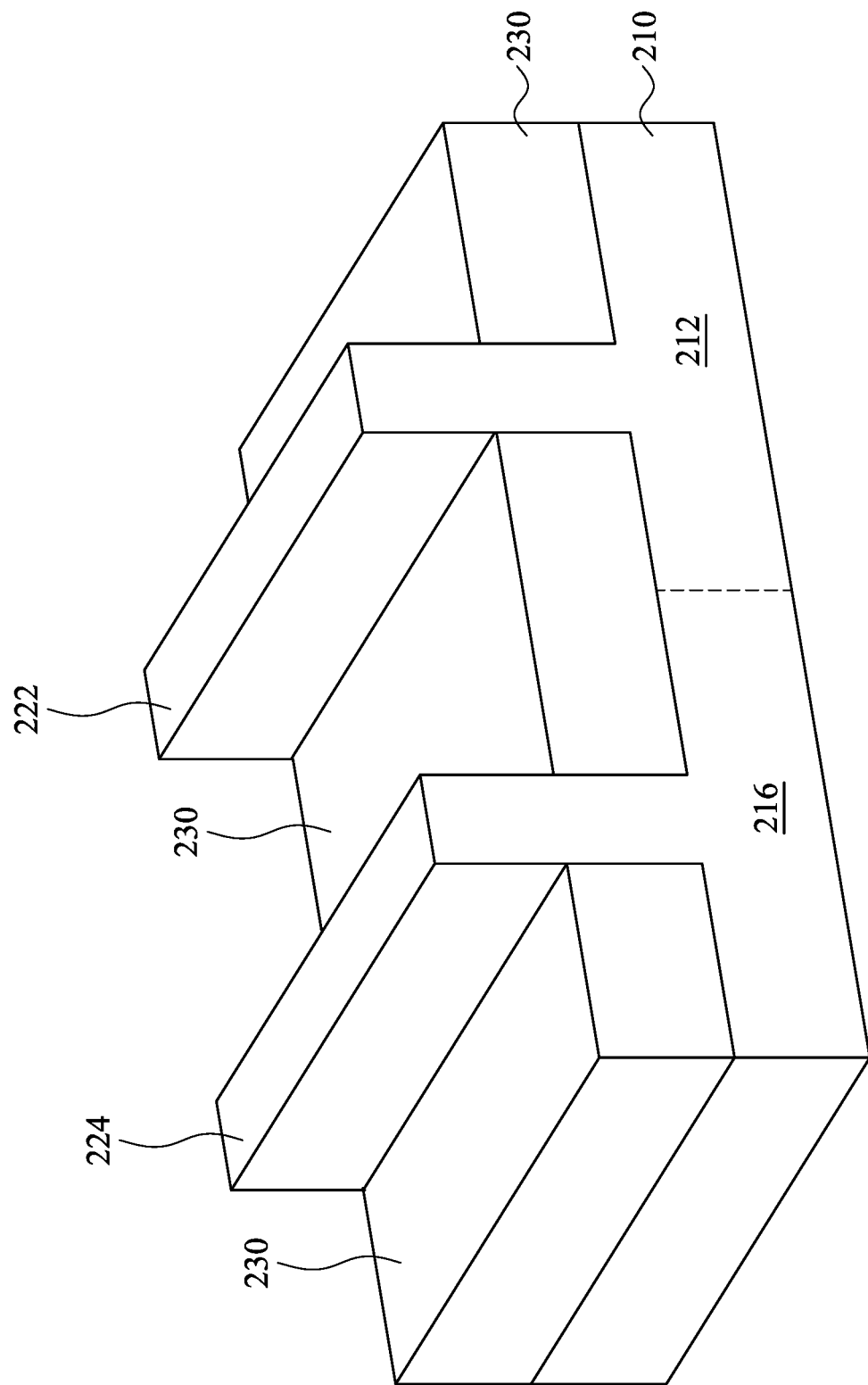

Reference is made to FIGS. 3A and 3B. A portion of the semiconductor fins 224 and 228 are removed. For example, a photomask (not shown) containing patterns for both the semiconductor fins 224 and 228 are used to protect portions of the semiconductor fins 224 and 228 to be kept. Exposed portions of both the semiconductor fins 224 and 228 are then etched at the same time.

Subsequently, a plurality of isolation structures 230 are formed on the substrate 210. The isolation structures 230, which act as a shallow trench isolation (STI) around the semiconductor fins 222, 224, 226, and 228, may be formed by chemical vapor deposition (CVD) techniques using tetra-ethyl-ortho-silicate (TEOS) and oxygen as a precursor. In some other embodiments, the isolation structures 230 may be formed by implanting ions, such as oxygen, nitrogen, carbon, or the like, into the substrate 210. In yet some other embodiments, the isolation structures 230 are insulator layers of a SOI wafer.

Figure 4A:
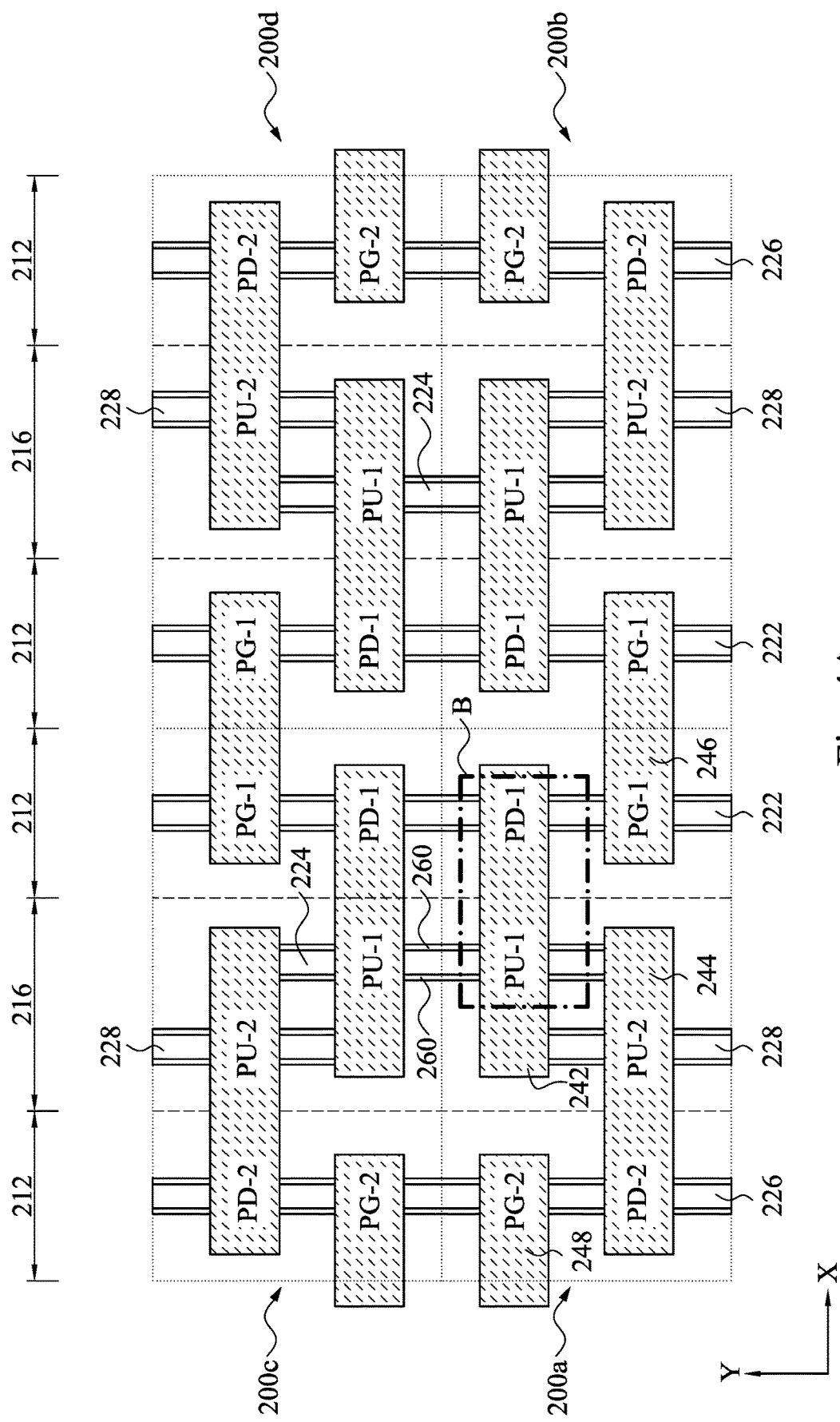
Figure 4B:
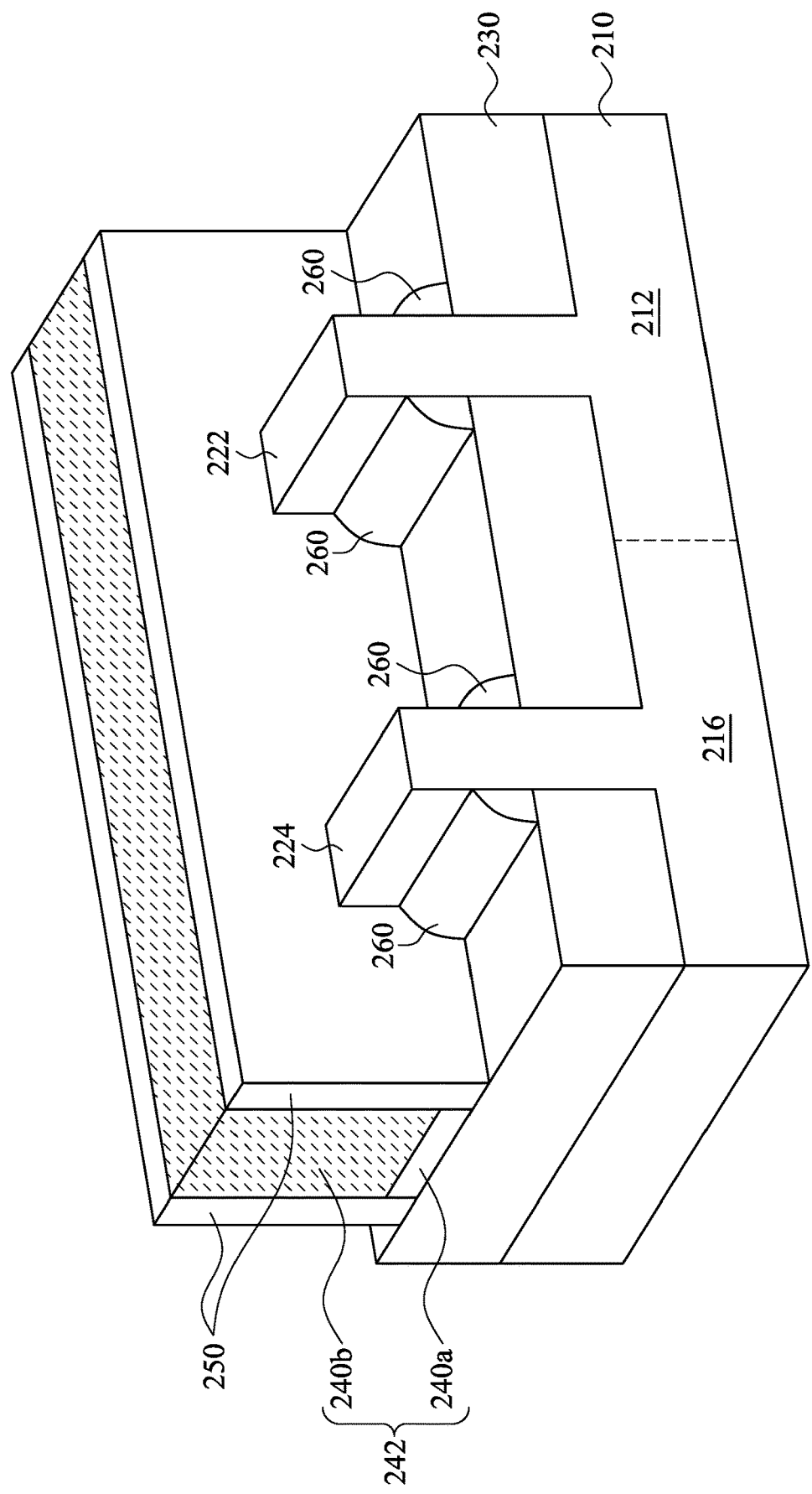

Reference is made to FIGS. 4A and 4B. A plurality of gate stacks 242, 244, 246, and 248 are formed on portions of the semiconductor fins 222, 224, 226, and 228 and expose another portions of the semiconductor fins 222, 224, 226, and 228. In greater detail, the gate stack 242 is formed on portions of the semiconductor fins 222, 224, and further on a portion of the semiconductor fin 228 in some embodiments; the gate stack 244 is formed on portions of the semiconductor fins 226 and 228, and further on a portion of the semiconductor fin 224 in some embodiments; the gate stack 246 is formed on portions of the semiconductor fins 222, and the gate stack 248 is formed on portions of the semiconductor fins 226.

As shown in FIG. 4B, at least one of the gate stacks 242, 244, 246, and 248 includes a gate insulator layer 240a and a gate electrode layer 240b. The gate insulator layer 240a is disposed between the gate electrode layer 240b and the substrate 210, and is formed on the semiconductor fins 222, 224, 226, and 228. The gate insulator layer 240a, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), silicon oxynitrides (SiON), and combinations thereof. The gate insulator layer 240a may have a multilayer structure such as one layer of silicon oxide (e.g., interfacial layer) and another layer of high-k material.

The gate insulator layer 240b may be formed using chemical vapor deposition (CVD), physical vapor deposition (PVD), atomic layer deposition (ALD), thermal oxide, ozone oxidation, other suitable processes, or combinations thereof. The gate electrode layers 240b are formed over the substrate 210 to cover the gate insulator layers 240a and the portions of the semiconductor fins 222, 224, 226, and 228. In some embodiments, the gate electrode layer 240b includes a semiconductor material such as polysilicon, amorphous silicon, or the like. The gate electrode layer 240b may be deposited doped or undoped. For example, in some embodiments, the gate electrode layer 240b includes polysilicon deposited undoped by low-pressure chemical vapor deposition (LPCVD). The polysilicon may also be deposited, for example, by furnace deposition of an in-situ doped polysilicon. Alternatively, the gate electrode layer 240b may include a polysilicon metal alloy or a metal gate including metals such as tungsten (W), nickel (Ni), aluminum (Al), tantalum (Ta), titanium (Ti), or any combination thereof.

In FIG. 4B, a plurality of gate spacers 250 are formed over the substrate 210 and along the side of the gate stacks 242, 244, 246, and 248. For clarity, the gate spacers 250 are illustrated in FIG. 4B and are omitted in FIG. 4A. In some embodiments, the gate spacers 250 may include silicon oxide, silicon nitride, silicon oxy-nitride, or other suitable material. The gate spacers 250 may include a single layer or multilayer structure. A blanket layer of the gate spacers 250 may be formed by CVD, PVD, ALD, or other suitable technique. Then, an anisotropic etching is performed on the blanket layer to form a pair of the gate spacers 250 on two sides of the gate stacks 242, 244, 246, and 248. In some embodiments, the gate spacers 250 are used to offset subsequently formed doped regions, such as source/drain regions. The gate spacers 250 may further be used for designing or modifying the source/drain region (junction) profile.

A plurality of dielectric fin sidewall structures 260 are formed on opposite sides of the semiconductor fins 222, 224, 226, and 228. The dielectric fin sidewall structures 260 are formed along the semiconductor fins 222, 224, 226, and 228. The dielectric fin sidewall structures 260 may include a dielectric material such as silicon oxide. Alternatively, the dielectric fin sidewall structures 260 may include silicon nitride, SiC, SiON, or combinations thereof. The formation methods for the dielectric fin sidewall structures 260 may include depositing a dielectric material over the semiconductor fins 222, 224, 226, and 228, and then anisotropically etching back the dielectric material. The etching back process may include a multiple-step etching to gain etch selectivity, flexibility and desired overetch control.

In some embodiments, the gate spacers 250 and the dielectric fin sidewall structures 260 may be formed in the same manufacturing process. For example, a blanket layer of dielectric layer may be formed to cover the gate stacks 242, 244, 246, and 248 and the semiconductor fins 222, 224, 226, and 228 by CVD, PVD, ALD, or other suitable technique. Then, an etching process is performed on the blanket layer to form the gate spacers 250 on opposite sides of the gate stacks 242, 244, 246, and 248 and form the dielectric fin sidewall structures 260 on opposite sides of the semiconductor fins 222, 224, 226, and 228. However, in some other embodiments, the gate spacers 250 and the dielectric fin sidewall structures 260 can be formed in different manufacturing processes.

In FIG. 4A, the semiconductor fin 222 and the gate stack 242 form a pull-down transistor PD-1, and the semiconductor fin 224 and the gate stack 242 form a pull-up transistor PU-1. In other words, the pull-down transistor PD-1 and the pull-up transistor PU-1 share the gate stack 242. The semiconductor fin 226 and the gate stack 244 form another pull-down transistor PD-2, and the semiconductor fin 228 and the gate stack 244 form another pull-up transistor PU-2. In other words, the pull-down transistor PD-2 and the pull-up transistor PU-2 share the gate stack 244. Moreover, the semiconductor fin 222 and the gate stack 246 form a pass-gate transistor PG-1. In other words, the pass-gate transistor PG-1 and the pull-down transistor PD-1 share the semiconductor fin 222. The semiconductor fin 226 and the gate stack 248 form another pass-gate transistor PG-2. In other words, the pass-gate transistor PG-2 and the pull-down transistor PD-2 share the semiconductor fin 226. Therefore, the SRAM cell 200a is a six-transistor (6T) SRAM. One of ordinary skill in the art, however, should understand that features of the various embodiments described herein may be used for forming other types of devices, such as an 8T-SRAM memory device.

In some embodiments, the number of the semiconductor fins 222 can be plural, and/or the number of the semiconductor fins 226 can be plural. Therefore, the pull-down transistors PD-1, PD-2, and the pass-gate transistors PG-1, PG-2 have a plurality of semiconductor fins per transistor, and the pull-up transistors PU-1 and PU-2 have one semiconductor fin per transistor, and the claimed scope is not limited in this respect.

In FIG. 4A, when the SRAM cells 200a-200d are arranged together to form an array (the SRAM device herein), the cell layouts may be flipped or rotated to enable higher packing densities. Often by flipping the cell over a cell boundary or axis and placing the flipped cell adjacent the original cell, common nodes and connections can be combined to increase packing density. For example, the SRAM cells 200a-200d are mirror images and in rotated images of each other. Specifically, the SRAM cells 200a and 200b are mirror images across a Y-axis, as is SRAM cells 200c and 200d. The SRAM cells 200a and 200c are mirror images across an X-axis, as is SRAM cells 200b and 200d. Further, the diagonal SRAM cells (the SRAM cells 200a and 200d; the SRAM cells 200b and 200c) are rotated images of each other at 180 degrees.

Figure 5A:
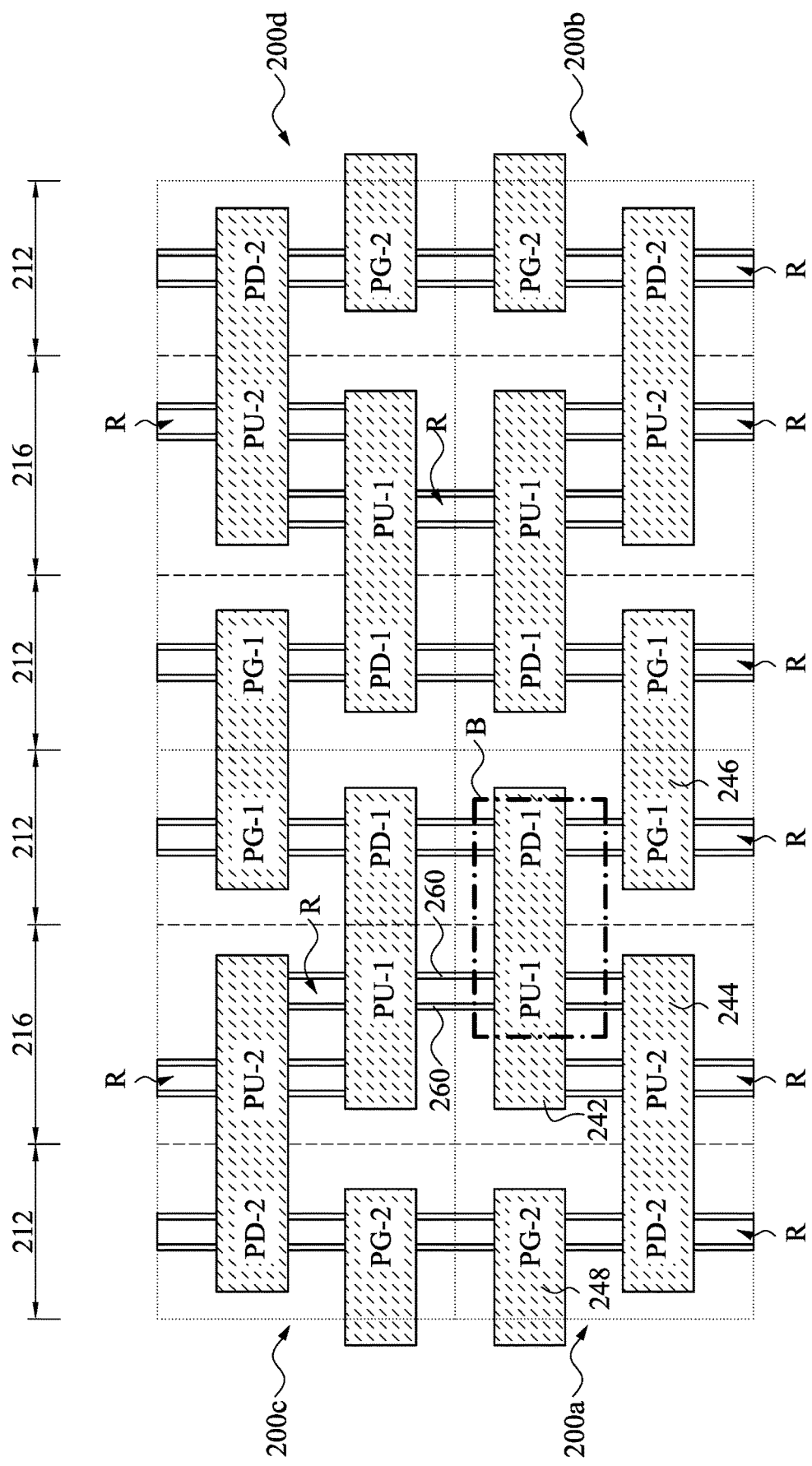
Figure 5B:
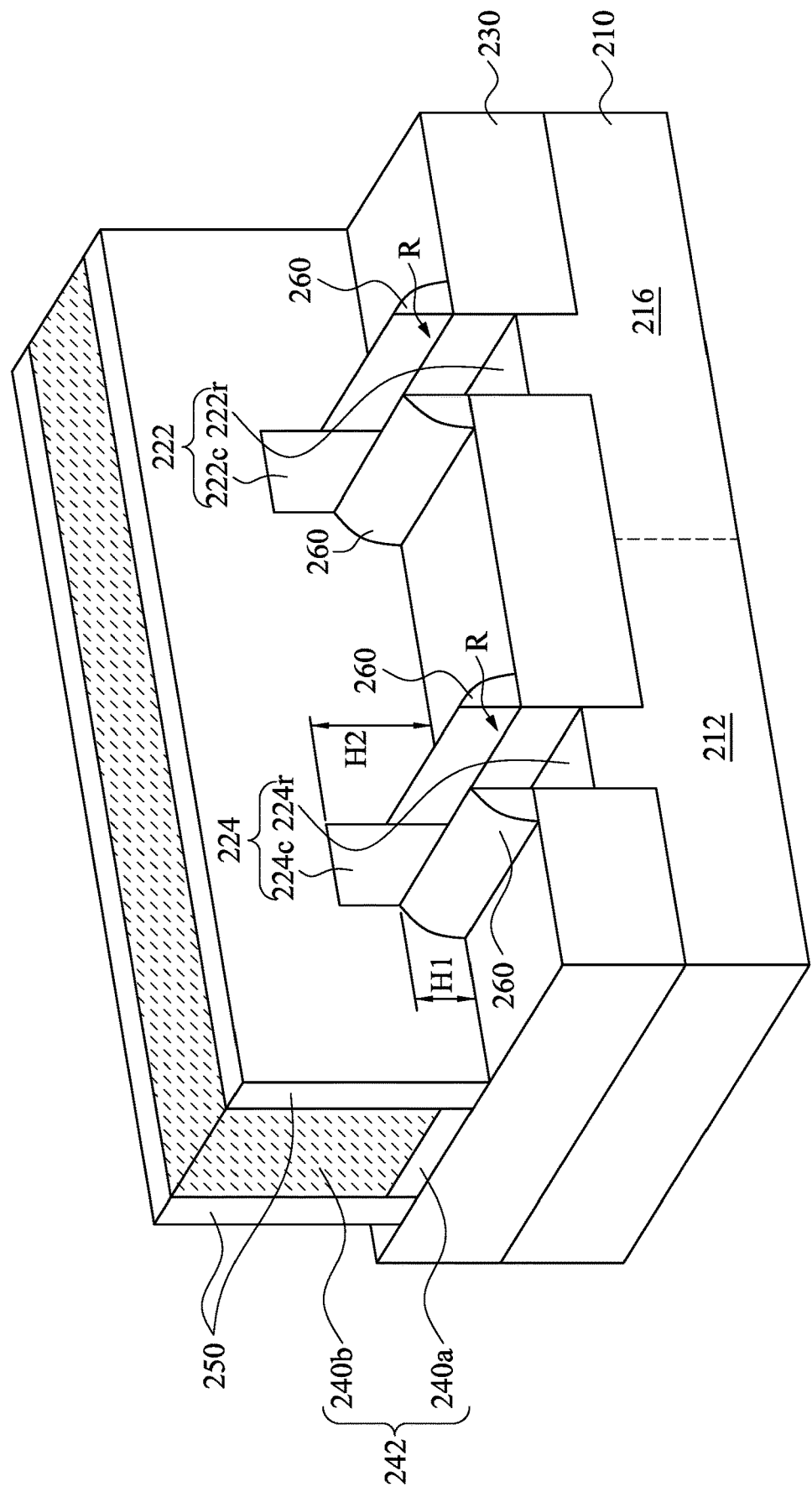

Reference is made to FIGS. 5A and 5B. A portion of the semiconductor fins 222, 224, 226, and 228 exposed both by the gate stacks 242, 244, 246, and 248 and the gate spacers 250 are partially removed (or partially recessed) to form recesses R in the semiconductor fins 222, 224, 226, and 228. In FIGS. 5A and 5B, the recesses R are formed with the dielectric fin sidewall structures 260 as its upper portion. In some embodiments, sidewalls of the recesses R are substantially and vertical parallel to each other. In some other embodiments, the recesses R are formed with a non-vertical parallel profile.

In FIG. 5B, the semiconductor fin 222 includes at least one recessed portion 222r and at least one channel portion 222c. The recess R is formed on the recessed portion 222r, and the gate stack 242 covers the channel portion 222c. The semiconductor fin 224 includes at least one recessed portion 224r and at least one channel portion 224c. The recess R is formed on the recessed portion 224r, and the gate stack 242 covers the channel portion 224c. Also, the semiconductor fins 226 and 228 (see FIG. 4A) individually include at least one recessed portion and at least one channel portion (not shown). Since the recessed portions and the channel portions of the semiconductor fins 226 and 228 have similar configurations to the recessed portions 222r and 224r and the channel portions 222c and 224c, and therefore, a description in this regard will not be repeated hereinafter.

At least one of the dielectric fin sidewall structures 260 has a height H1, and at least one of the semiconductor fins 222, 224, 226, and 228 has a height H2 protruding from the isolation structures 230 (i.e., the channel portions 222c, 224c). The height H1 is lower than the height H2. In some embodiments, the height H1 and the height H2 satisfies the condition: $0.1 \leq (H1/H2) \leq 0.5$, and the claimed scope is not limited in this respect. The height H1 of the dielectric fin sidewall structures 260 can be tuned, for example, by etching, to adjust the profile of the epitaxy structures 272 and 276 (see FIGS. 6A and 6B) formed thereon.

The recessing process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 6A:
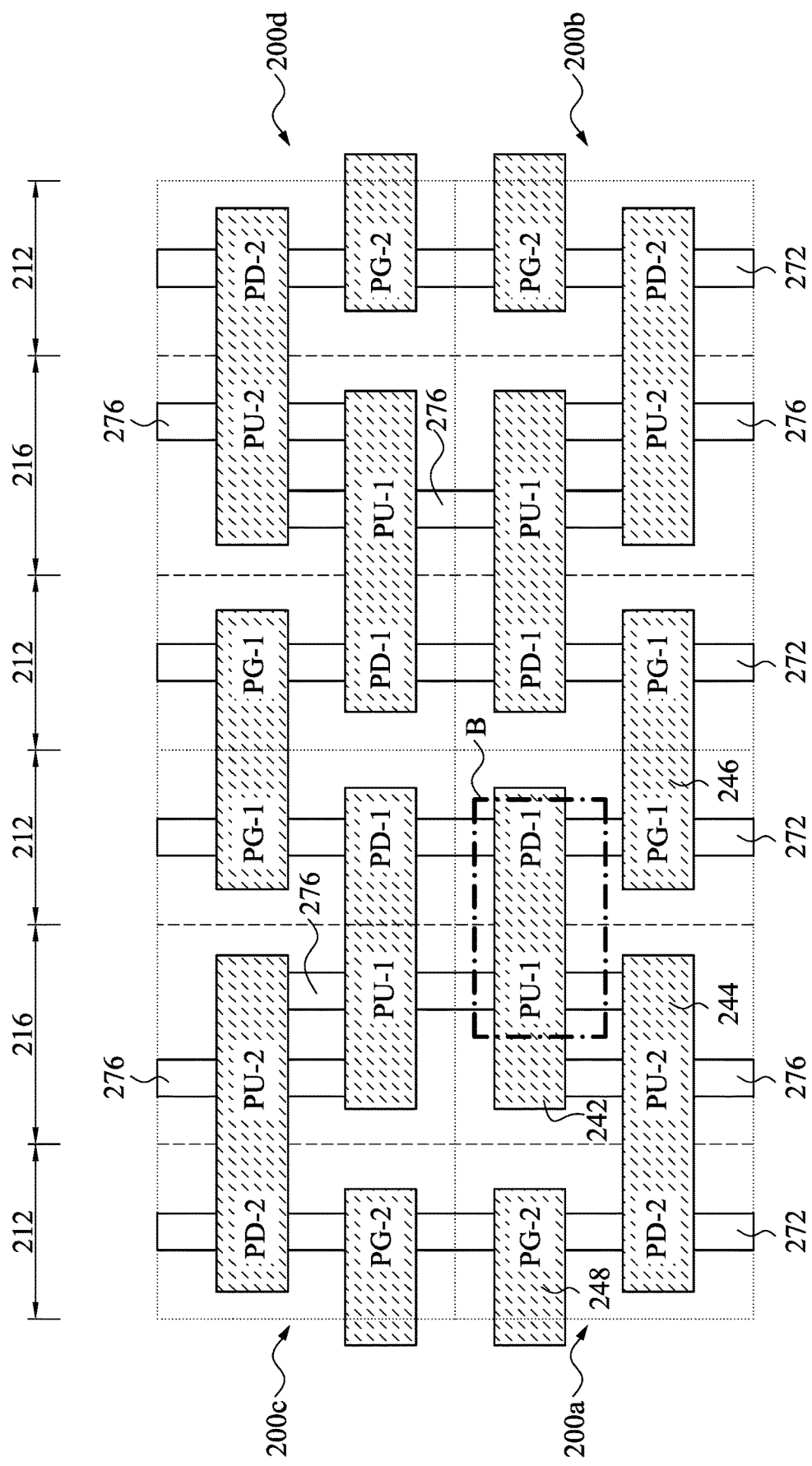
Figure 6B:
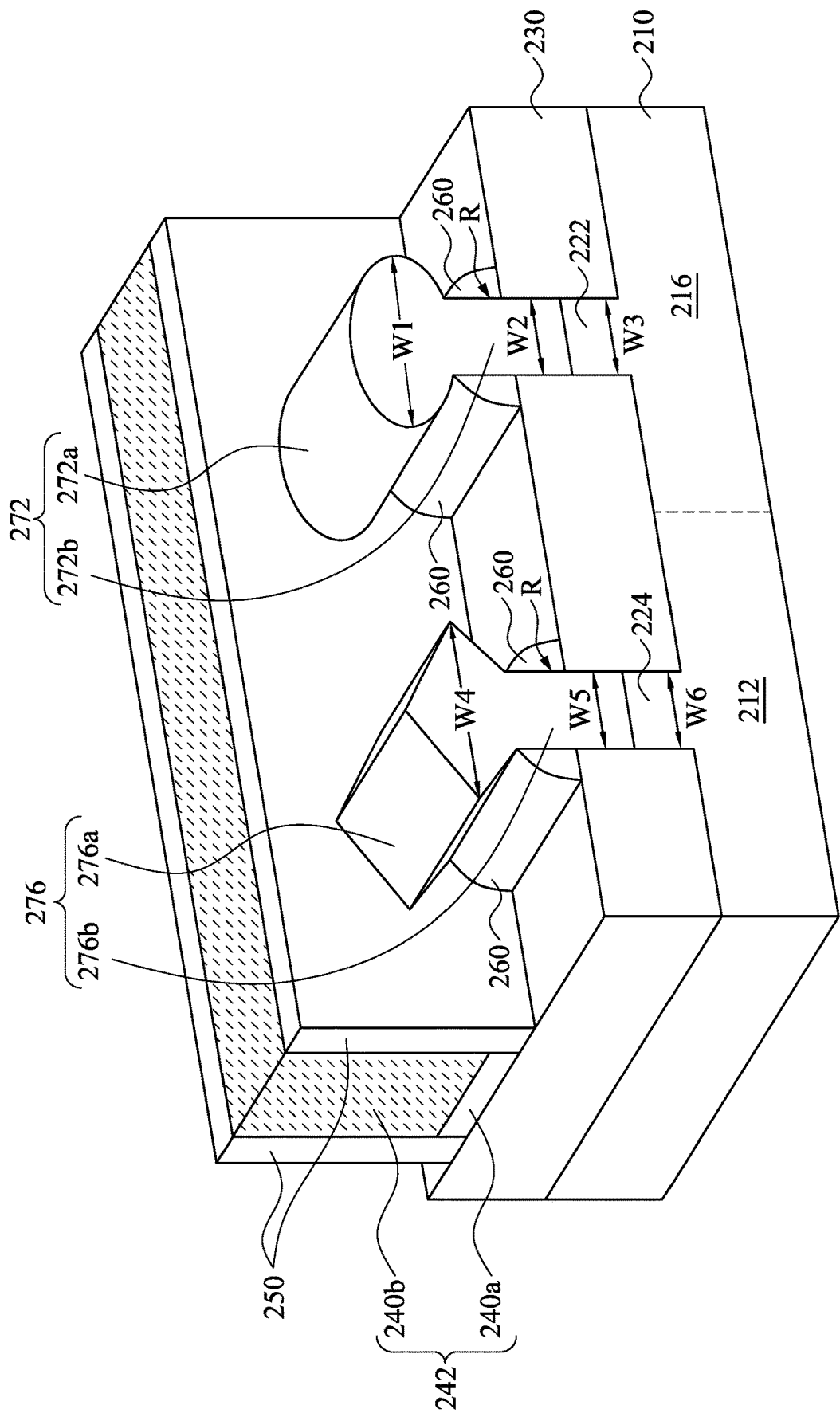

Reference is made to FIGS. 6A and 6B. A plurality of epitaxy structures 272 are respectively formed in the recesses R of the semiconductor fins 222 and 226 (see FIG. 4A), and a plurality of epitaxy structures 276 are respectively formed in the recesses R of the semiconductor fins 224 and 228 (see FIG. 4A). The epitaxy structure 272 is separated from the adjacent epitaxy structure 276. The epitaxy structures 272 and 276 protrude from the recesses R. The epitaxy structures 272 can be n-type epitaxy structures, and the epitaxy structures 276 can be p-type epitaxy structures. The epitaxy structures 272 and 276 may be formed using one or more epitaxy or epitaxial (epi) processes, such that Si features, SiGe features, and/or other suitable features can be formed in a crystalline state on the semiconductor fins 222, 224, 226, and 228. In some embodiments, lattice constants of the epitaxy structures 272 and 276 are different from lattice constants of the semiconductor fins 222, 224, 226, and 228, and the epitaxy structures 272 and 276 are strained or stressed to enable carrier mobility of the SRAM device and enhance the device performance. The epitaxy structures 272 and 276 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

In some embodiments, the epitaxy structures 272 and 276 are formed in different epitaxy processes. The epitaxy structures 272 may include SiP, SiC, SiPC, Si, III-V compound semiconductor materials or combinations thereof, and the epitaxy structures 276 may include SiGe, SiGeC, Ge, Si, III-V compound semiconductor materials, or combinations thereof. During the formation of the epitaxy structures 272, n-type impurities such as phosphorous or arsenic may be doped with the proceeding of the epitaxy. For example, when the epitaxy structure 272 includes SiC or Si, n-type impurities are doped. Moreover, during the formation of the epitaxy structures 276, p-type impurities such as boron or $BF_2$ may be doped with the proceeding of the epitaxy. For example, when the epitaxy structure 276 includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 222, 224, 226, and 228 (e.g., silicon). Thus, a strained channel can be achieved to increase carrier mobility and enhance device performance. The epitaxy structures 272 and 276 may be in-situ doped. If the epitaxy structures 272 and 276 are not in-situ doped, a second implantation process (i.e., a junction implant process) is performed to dope the epitaxy structures 272 and 276. One or more annealing processes may be performed to activate the epitaxy structures 272 and 276. The annealing processes include rapid thermal annealing (RTA) and/or laser annealing processes.

In some embodiments, the epitaxy structure 272 has a top portion 272a and a body portion 272b disposed between the top portion 272a and the substrate 210. The top portion 272a has a width W1, and the body portion 270b has a width W2 shorter than the width W1. At least one of the semiconductor fins 222 and 226 has a width W3 substantially the same as the width W2. The dielectric fin sidewall structures 260 are disposed on opposite sides of the body portions 272b of the epitaxy structures 272, and the top portion 272a of the epitaxy structures 272 is disposed on the dielectric fin sidewall structures 260.

Moreover, the epitaxy structure 276 has a top portion 276a and a body portion 276b disposed between the top portion 276a and the substrate 210. The top portion 276a has a width W4, and the body portion 276b has a width W5 shorter than the width W4. At least one of the semiconductor fins 222 and 226 has a width W6 substantially the same as the width W5. The dielectric fin sidewall structures 260 are disposed on opposite sides of the body portions 276b of the epitaxy structures 276, and the top portion 276a of the epitaxy structures 276 is disposed on the dielectric fin sidewall structures 260.

In some embodiments, the epitaxy structures 272 and 276 have different shapes. The top portions 272a of the epitaxy structures 272 can have at least one substantially facet surface presented above the dielectric fin sidewall structures 260, and the top portions 276a of the epitaxy structures 276 can have at least one non-facet (or round) surface presented above the dielectric fin sidewall structures 260, and the claimed scope is not limited in this respect.

In FIG. 6A, the semiconductor fin 222 (see FIG. 4A), the epitaxy structure 272 formed thereon, the dielectric fin sidewall structures 260 formed on opposite sides of the epitaxy structure 272, and the gate stack 242 together form the pull-down transistor PD-1, where the semiconductor fin 222 and the epitaxy structure 272 serve as a source/drain of the pull-down transistor PD-1. The semiconductor fin 224 (see FIG. 4A), the epitaxy structure 276 formed thereon, the dielectric fin sidewall structures 260 formed on opposite sides of the epitaxy structure 276, and the gate stack 242 together form the pull-up transistor PU-1, where the semiconductor fin 224 and the epitaxy structure 276 serve as a source/drain of the pull-up transistor PU-1. The semiconductor fin 226 (see FIG. 4A), the epitaxy structure 272 formed thereon, the dielectric fin sidewall structures 260 formed on opposite sides of the epitaxy structure 272, and the gate stack 244 together form the pull-down transistor PD-2, where the semiconductor fin 226 and the epitaxy structure 272 serve as a source/drain of the pull-down transistor PD-2. The semiconductor fin 228 (see FIG. 4A), the epitaxy structure 276 formed thereon, the dielectric fin sidewall structures 260 formed on opposite sides of the epitaxy structure 276, and the gate stack 244 together form the pull-up transistor PU-2, where the semiconductor fin 228 and the epitaxy structure 276 serve as a source/drain of the pull-up transistor PU-2. The semiconductor fin 222, the epitaxy structure 272 formed thereon, the dielectric fin sidewall structures 260 formed on opposite sides of the epitaxy structure 272, and the gate stack 246 together form the pass-gate transistor PG-1, where the semiconductor fin 222 and the epitaxy structure 272 serve as a source/drain of the pass-gate transistor PG-1. The semiconductor fin 226, the epitaxy structure 272 formed thereon, the dielectric fin sidewall structures 260 formed on opposite sides of the epitaxy structure 272, and the gate stack 248 together form the pass-gate transistor PG-2, where the semiconductor fin 226 and the epitaxy structure 272 serve as a source/drain of the pass-gate transistor PG-2. Therefore, the SRAM cell 200a is a six-transistor (6T) SRAM. One of ordinary skill in the art, however, should understand that features of the various embodiments described herein may be used for forming other types of devices, such as an 8T-SRAM memory device.

According to the aforementioned embodiments, since the dielectric fin sidewall structures are disposed on opposite sides of at least one of the semiconductor fins, the formation of the epitaxy structures can be tuned by the dielectric fin sidewall structures. In greater detail, the epitaxy growth of the epitaxy structures extends both vertically and laterally. The lateral epitaxy growth will enlarge the dimension of the epitaxy structures and narrow the spacing therebetween. However, the dielectric fin sidewall structures can suppress the lateral epitaxy growth of the epitaxy structures, such that the spaces therebetween can be reduced to prevent the epitaxy structures from merging together. Hence, the performance of the SRAM device can be improved.

According to some embodiments, a semiconductor device comprises a transistor, an isolation structure, and a fin sidewall structure. The transistor includes a fin extending from a substrate and an epitaxy structure grown on the fin. The isolation structure is above the substrate. The fin sidewall structure is above the isolation structure and is on a sidewall of the epitaxy structure.

According to some embodiments, a method for manufacturing a semiconductor device comprises etching a substrate to form a fin, forming an isolation structure above the substrate, forming a fin sidewall structure above the isolation structure and on a sidewall of the fin, etching the fin to form a recess defined by the fin sidewall structure, and growing an epitaxy structure in the recess.

According to some embodiments, a method for manufacturing a semiconductor device comprises etching a substrate to form first and second fins, forming an isolation structure above the substrate, forming a fin sidewall structure above the isolation structure and on a sidewall of the first fin, and growing first and second epitaxial structures respectively on the first and second fins such that the second epitaxial structure has a different shape than the first epitaxial structure and such that a top portion of the first epitaxy structure is above the fin sidewall structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) cell comprising:
    a semiconductor fin;
    an isolation structure laterally surrounding the semiconductor fin;
    a first gate structure crossing the semiconductor fin to form a pull-down (PD) transistor;
    a second gate structure crossing the semiconductor fin to form a pass-gate (PG) transistor;
    an epitaxy structure on the semiconductor fin and between the first and second gate structures; and
    a first fin sidewall structure on a first side of the epitaxy structure and between the first and second gate structures, wherein the epitaxy structure is in contact with both a sidewall of the isolation structure and a sidewall of the first fin sidewall structure.

2. The SRAM cell of claim 1, wherein the epitaxy structure is taller than the first fin sidewall structure.

3. The SRAM cell of claim 1, wherein a bottom surface of the epitaxy structure is lower than a bottom surface of the first fin sidewall structure.

4. The SRAM cell of claim 1, further comprising a second fin sidewall structure on a second side of the epitaxy structure opposite to the first side.

5. The SRAM cell of claim 4, wherein the first fin sidewall structure has a height substantially the same as a height of the second fin sidewall structure.

6. The SRAM cell of claim 1, further comprising a gate spacer on a sidewall of the first gate structure and that has the same material as the first fin sidewall structure.

7. The SRAM cell of claim 4, wherein the epitaxy structure has a first facet extending upwards from the first fin sidewall structure and a second facet extending upwards from the second fin sidewall structure, and a bottom of the first facet is substantially level with a bottom of the second facet.

8. The SRAM cell of claim 1, wherein the first fin sidewall structure is in direct contact with the isolation structure.

9. A static random access memory (SRAM) cell comprising:
    at least one inverter comprising a pull-up (PU) transistor and a pull-down (PD) transistor, wherein at least one of the PU transistor and the PD transistor comprises:
        a semiconductor fin over a substrate and having a first width;
        an epitaxy structure above the semiconductor fin, wherein the epitaxy structure comprises:
            a top portion having a second width; and
            a base portion between the top portion and the semiconductor fin and having a third width smaller than the second width and substantially the same as the first width; and a pair of fin sidewall structures on opposite sides of the base portion of the epitaxy structure, wherein a first sidewall of the base portion of the epitaxy structure in contact with one of the pair of fin sidewall structures has a height substantially the same as a height of a second sidewall of the base portion of the epitaxy structure in contact with another of the pair of fin sidewall structures.

10. The SRAM cell of claim 9, wherein the pair of fin sidewall structures are spaced apart from the top portion of the epitaxy structure.

11. The SRAM cell of claim 9, wherein the substrate has at least one p-well region and at least one n-well region, wherein the PD transistor is over the p-well region.

12. The SRAM cell of claim 11, wherein the PU transistor is over the n-well region.

13. The SRAM cell of claim 9, further comprising an isolation structure adjacent to the semiconductor fin, and the epitaxy structure is in direct contact with the isolation structure.

14. The SRAM cell of claim 9, wherein the top portion of the epitaxy structure has facets.

15. A method for manufacturing a static random access memory (SRAM) cell comprising:

forming a first semiconductor fin and a second semiconductor fin above a substrate;

forming an isolation structure to laterally surround the first and second semiconductor fins;

forming a gate structure crossing the first and second semiconductor fins to form a pull-up (PU) transistor and a pull-down (PD) transistor;

forming a fin sidewall structure on a side of the first semiconductor fin;

forming a recess in the first semiconductor fin to expose a sidewall of the fin sidewall structure and a sidewall of the isolation structure; and growing an epitaxy structure in the recess and in direct contact with the isolation structure.

16. The method of claim 15, wherein growing the epitaxy structure is such that a top portion of the epitaxy structure has a facet.

17. The method of claim 15, wherein growing the epitaxy structure is such that a top portion of the epitaxy structure has no facet.

18. The method of claim 15, wherein the epitaxy structure is an n-type epitaxy structure.

19. The method of claim 15, wherein the epitaxy structure is a p-type epitaxy structure.

20. The method of claim 15, wherein a height of the fin sidewall structure is tuned by performing an etching process.

* * * * *